(12) United States Patent
Wu et al.

(10) Patent No.: US 7,061,041 B2
(45) Date of Patent: Jun. 13, 2006

(54) MEMORY DEVICE

(75) Inventors: Tin-Wei Wu, Hsinchu (TW); Po-An Chen, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 30 days.

(21) Appl. No.: 10/711,930

(22) Filed: Oct. 13, 2004

(65) Prior Publication Data

US 2006/0038219 A1 Feb. 23, 2006

(30) Foreign Application Priority Data

Aug. 23, 2004 (TW) .............................. 93125312 A

(51) Int. Cl.
*H01L 29/788* (2006.01)
*H01L 29/76* (2006.01)
*H01L 29/94* (2006.01)
*H01L 29/00* (2006.01)
*H01L 29/40* (2006.01)

(52) U.S. Cl. ...................... 257/315; 257/774; 257/374; 257/510

(58) Field of Classification Search ................ 257/315, 257/374, 774, 397, 510, 523
See application file for complete search history.

(56) References Cited

U.S. PATENT DOCUMENTS

| 6,146,970 A | * | 11/2000 | Witek et al. ................ 438/424 |
| 6,806,132 B1 | * | 10/2004 | Mori et al. ................. 438/221 |
| 2002/0187615 A1 | * | 12/2002 | Liou ........................... 438/424 |

* cited by examiner

*Primary Examiner*—Chuong Anh Luu
(74) *Attorney, Agent, or Firm*—Jiang Chyun IP Office

(57) ABSTRACT

A memory device is provided. The memory device comprises a substrate, first isolation structures, stacked device structures, and second isolation structures. The substrate comprises a memory cell area and a periphery area having trenches therein. Each stacked device structure is disposed between two neighboring trenches over the substrate. The stacked device structure comprises a gate dielectric layer and a gate layer. The gate dielectric layer covers part of the substrate. The second isolation structures are disposed between neighboring stacked device structures. The second isolation structure comprises a liner and an isolation layer. The liner is disposed on the sidewalls of the gate dielectric layer, the surface of the trenches, and the surface of the substrate not covered by the dielectric layer. The liner over the surface of the substrate not covered by the dielectric layer has a round curve. The isolation layer covers the liner, and fills the trenches.

4 Claims, 7 Drawing Sheets

MEMORY DEVICE

CROSS-REFERENCE TO RELATED APPLICATION

This application claims the priority benefit of Taiwan application serial no. 93125312 filed Aug. 23, 2004.

BACKGROUND OF THE INVENTION

1. Field of the Invention

The present invention relates to a semiconductor device, and more particularly, to a memory device.

2. Description of the Related Art

For various non-volatile memories, electrically erasable programmable read-only memories (EEPROMs) can read, write, program and erase memory cells for multiple times and still maintain the stored data even when the power is off. Accordingly, EEPROMs have been widely applied in apparatus such as personal computers and electronic devices.

EEPROM is a non-volatile memory which has advantages such as small cell size, a high read/write speed and low power consumption. In addition, the data erasing in an EEPROM is performed by a block-by-block method. Therefore, EEPROM has a desired operational speed.

EEPROM comprises memory cells in the cell area and logic devices in the peripheral circuit. The memory cells and the logic devices are separated by shallow trench isolation (STI) structures. Moreover, since the operational voltages required for the memory cells and the logic devices are different the gate dielectric layers for the memory cells and the logic devices should be fabricated in separate processes.

FIGS. 1A–1C are cross sectional views showing a progression of a conventional method of fabricating EEPROM.

Referring to FIG. 1A, the substrate 100 is provided, which comprises the memory cell area 102 and the peripheral circuit area 104. The patterned tunneling layer 106, the floating gate 108 and the mask layer 110 are formed over the substrate 100. The mask layer 110 serves as a self-align mask for etching the substrate 100 so as to form the trenches 112 in the substrate 100 of the memory cell area 102 and the trenches 114 in the substrate 100 of the peripheral circuit 104.

Referring to FIG. 1B, the liner 116 is formed on the surfaces of the trenches 112 and 114, and sidewalls of the floating gate 108 and the tunneling layer 106. The isolation layer 118 is then filled in the trenches 112 and 114. The mask layer 110 and a portion of the isolation layer 118 are removed so as to form the isolation structure 120 in the memory cell area 102, and the isolation structure 122 in the peripheral circuit area 104.

Referring to FIG. 1C, the inter-gate dielectric layer 124 is formed over the surface of the floating gate 108 in the memory cell area 102. Then, the tunneling layer 106 and the floating gate 108 in the peripheral circuit area 104 are removed. The removing can be performed, for example, by a wet-etch process. Next, the gate dielectric layer 128 is formed over the substrate 100 in the peripheral circuit area 104. The control gate 130 is formed over the inter-gate dielectric layer 124 in the memory cell area 102. The gate layer 132 is formed over the gate dielectric layer 128 in the peripheral circuit area 104.

In the conventional process, the device isolation area, i.e. the area for the to-be-formed isolation structure, is defined by using the self-align mask so as to precisely control the critical dimension (CD) of the devices in the memory cell area 102. The logic devices in the peripheral circuit area 104, however, requires an operating voltage which is different from that of the memory cells in the memory cell area 102. Accordingly, the formed tunneling layer 106 cannot serve as a gate dielectric layer 128 for the logic devices and so the gate dielectric layer 128 should be formed in an additional process. Still, while forming the gate dielectric layer 128, the floating gate 108 and the tunneling layer 106 are first removed in an isotropic wet-etch process. As a result, the neighboring isolation structure 122 can be damaged during the etch process, forming an isolation structure with a hump shape 126 as shown. The isolation structure with the hump shape 126 will deteriorate electrical isolation of the isolation structure 122 in the peripheral circuit area 104, which will result in leakage currents. Moreover, during the subsequent process of forming the gate layer 132, the gate material may be filled in the notches of the isolation structure 122.

SUMMARY OF THE INVENTION

Accordingly, the present invention is directed to a memory device to resolve the damage issue on the trench isolation structures of the peripheral circuit area during the manufacturing process.

The present invention provides a memory device. The memory device comprises a substrate, at least one stacked structure of memory cell, a plurality of first isolation structures, at least one stacked device structure and a plurality of second isolation structures. The substrate comprises a memory cell area and a peripheral circuit area. The memory cell area comprises a plurality of first trenches. The peripheral circuit area comprises a plurality of second trenches. Each stacked structure of memory cell is disposed between two neighboring first trenches in the memory cell area over the substrate. The stacked structure of memory cell comprises at least a tunneling layer, a floating gate, an inter-gate dielectric layer and a control gate layer. In addition, the first isolation structure is disposed between the stacked structures of memory cells in the memory cell area. The first isolation structure comprises a first liner and a first isolation layer. Wherein, the first liner is disposed on sidewalls of the tunneling layer and the floating gate and on a surface of the first trench. Further, the first isolation layer covers the first liner, filling at least the first trench. Each stacked device structure is disposed between two neighboring second trenches in the peripheral circuit area over the substrate. The stacked device structure comprises at least a gate dielectric layer and a gate layer, wherein the gate dielectric layer covers part of the substrate. In addition, the second isolation structure is disposed between the stacked device structures in the peripheral circuit. The second isolation structure comprises a second liner and a second isolation layer. Wherein, the second liner is disposed on a sidewall of the gate dielectric layer, a surface of the second trench and part of a surface of the substrate not covered by the gate dielectric layer. The second liner disposed in areas not covered by the gate dielectric layer has round curves. The second isolation layer covers the second liner, filling at least the second trench.

During the process of fabricating the stacked structure of memory cell in the memory cell area, a thick liner is formed on the surface of the tunneling layer not covered by the floating gate in the peripheral circuit area. While removing the floating gate and tunneling layer in the process of fabricating the stacked device structure in the peripheral circuit area, the thicker liner can prevent substantial damage on the second isolation structure. Accordingly, the second isolation structure is intact and maintains the desired electrical isolation performance. In other words, after removing the floating gate and the tunneling layer, the liner at the area not covered by the gate dielectric layer in the peripheral circuit area has a round curve.

The above and other features of the present invention will be better understood from the following detailed description of the embodiments of the invention that is provided in communication with the accompanying drawings.

DESCRIPTION OF THE EMBODIMENTS

FIGS. 2A–2D are cross sectional views showing a progression of a method of fabricating a shallow trench isolation according to an embodiment of the present invention.

Figure 1A:
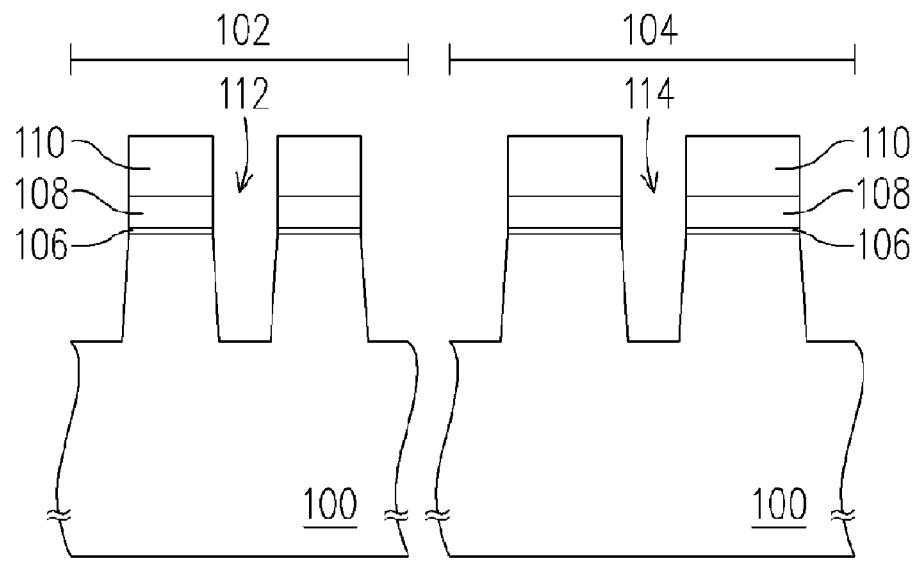
FIGS. 1A–1C are cross sectional views showing a progression of a conventional method of fabricating an EEPROM.
Figure 1B:
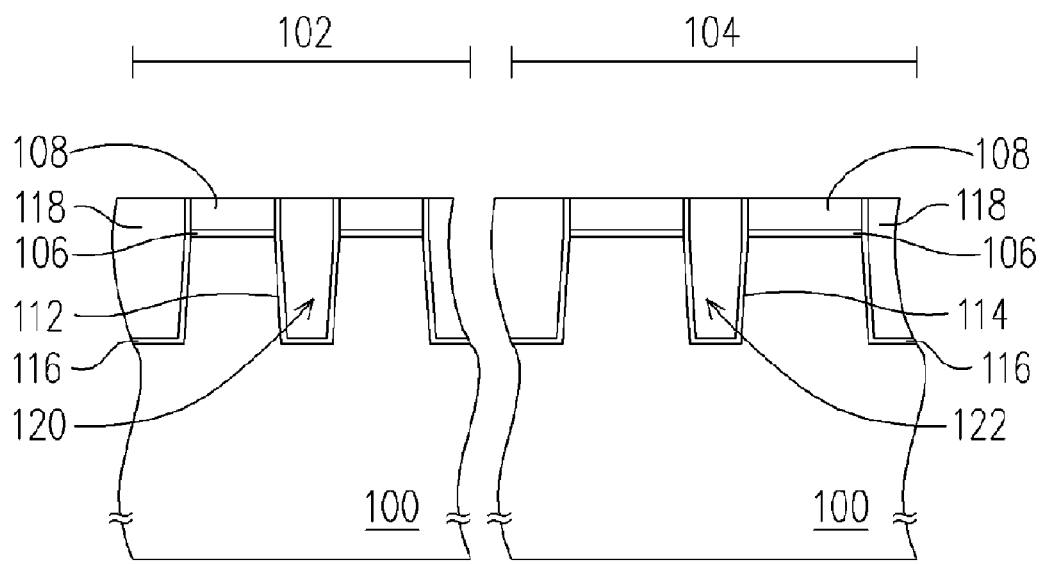
Figure 1C:
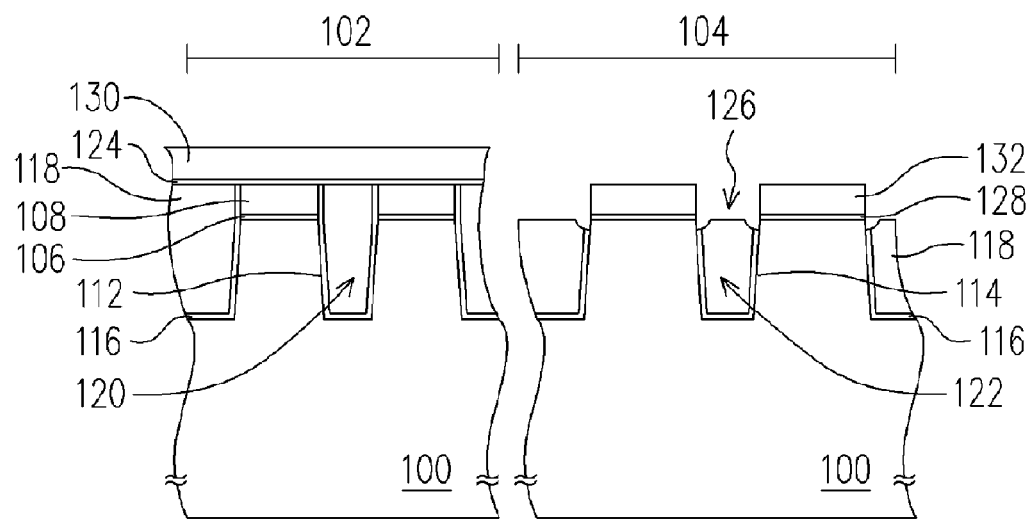
Figure 2A:
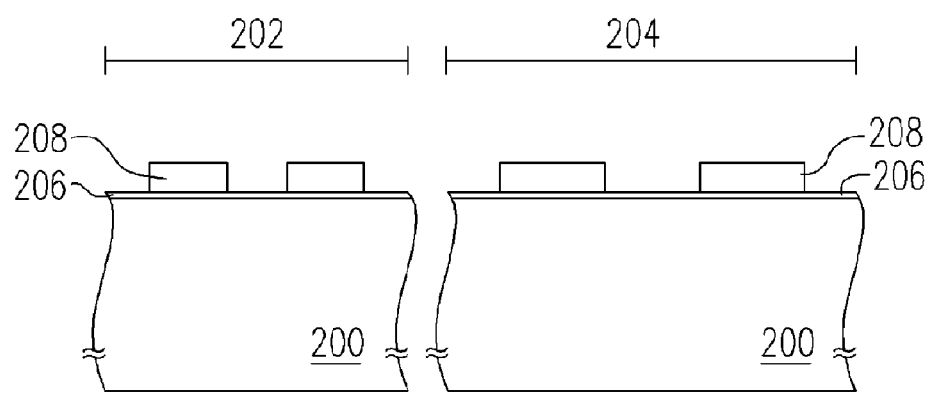
FIGS. 2A–2D are cross sectional views showing a progression of a method of fabricating a shallow trench isolation according to an embodiment of the present invention.

Referring to FIG. 2A, a substrate 200 is provided, which comprises a first device area 202 and a second device area 204. A protection layer 206 and a patterned mask layer 208 are formed over the substrate 200. Wherein, the material of the protection layer 206 can be a dielectric material, such as silicon oxide. The silicon oxide protection layer 206 can be formed, for example, by thermal oxidation. In some embodiments, the mask layer 208 can be made of a conductive material, such as polysilicon, doped polysilicon or other conductive materials. In particular, the conductive mask layer 208 formed in the first device area 202 can be preserved in subsequent process as a gate. In the other embodiments, when the mask layer 208 is made of conductive material, an additional mask layer (not shown) can be formed to cover the mask layer 208. The additional mask layer can be made of silicon nitride.

Figure 2B:
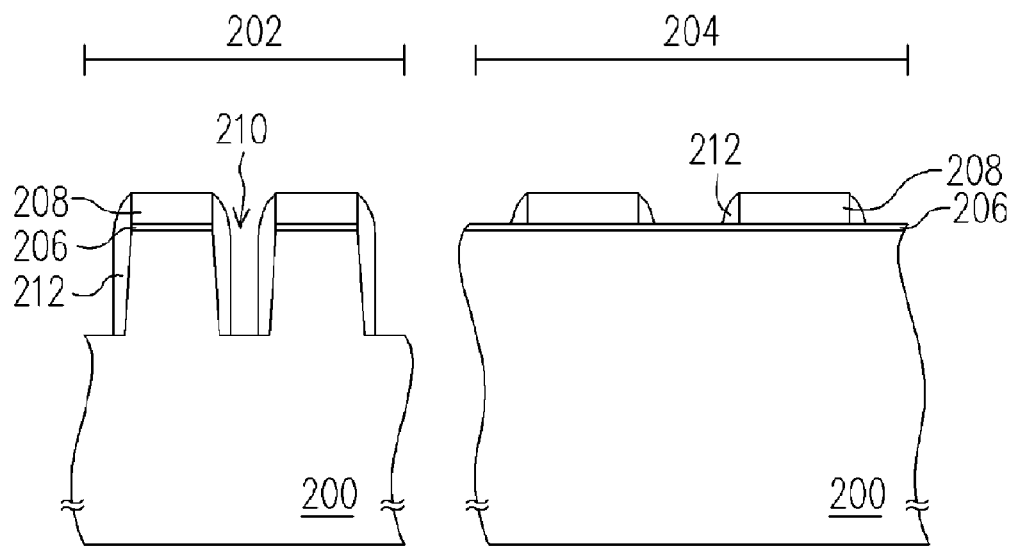

Referring to FIG. 2B, by using the patterned mask layer 208 in the first device area 202 as a self-align mask, the protection layer 206 and the substrate 200 are etched so as to form the trenches 210 in the substrate 200 of the first device area 202. The etching method can be, for example, an anisotropic etching process.

Spacers 212 are formed on the sidewalls of the mask layer 208 in the second device area 204. The spacers 212 can be made of oxide or nitride. In some embodiment, the spacers 212 are further formed on the sidewalls of the trenches 210 and the mask layer 208 in the first device area 202. The process of forming the spacers 212 may comprise, for example, forming a conformal isolation layer over the substrate 200, and performing an anisotropic etching process on the conformal isolation layer.

Figure 2C:
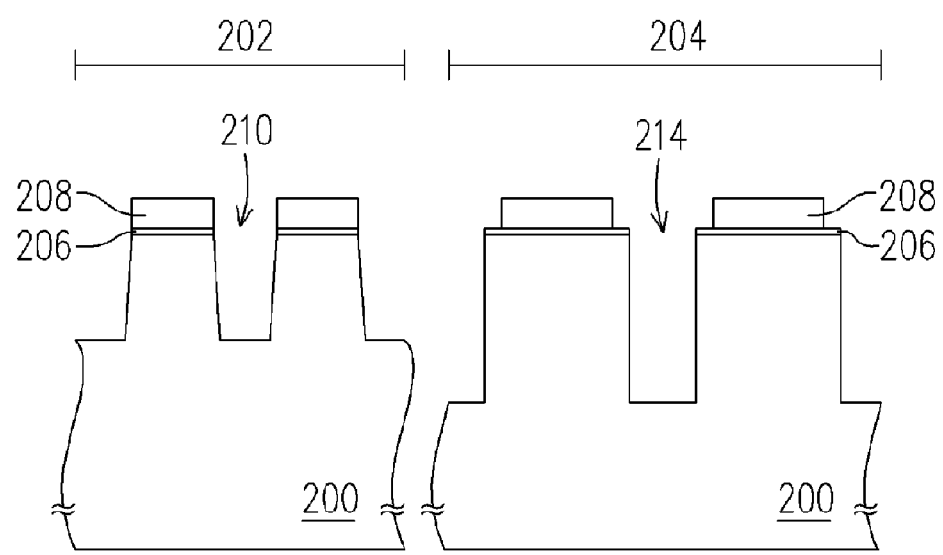

Referring to FIG. 2C, the mask layer 208 and the spacers 212 in the second device area 204 serve as a self-align mask for etching the protection layer 206 and the substrate 200. The trenches 214 are thus formed in the substrate 200 of the second device area 204. In some embodiments, if high-voltage devices are to be formed in the second device area 204, the trenches 214 should be deeper than the first trenches 210 in the first device area 202. With the deeper trenches 214, the isolation performance of the isolation structure is improved. Thereafter, the spacers 212 are then removed.

Figure 2D:
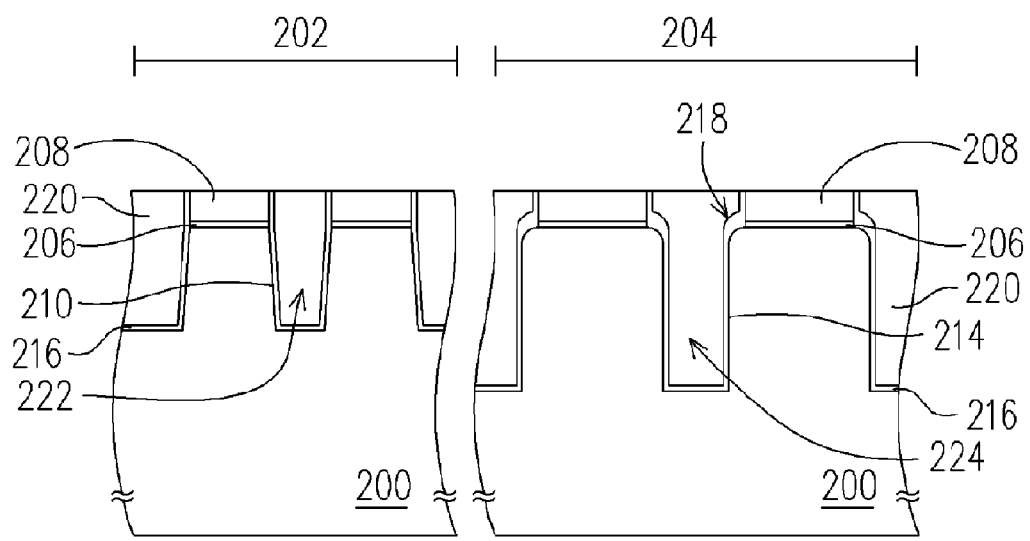

Referring to FIG. 2D, a liner 216 is formed on the sidewalls of the exposed mask layer 208, the surfaces of the trenches 210 and 214, and the surface of the exposed protection layer 206 in the second device area 204. The liner 216 can be made of silicon oxide, which can be formed, for example, by thermal oxidation. In particular, if the protection layer 206 is silicon oxide, the exposed protection layer 206 in the second device area 204 will be oxidized. Accordingly, an area of the liner 216 indicated by 218 will form a round curve. In some embodiments, due to the rounding of the liner 216 over the exposed protection layer 206, the liner 216 thereon is thicker than that on the other areas.

An isolation layer 220 is then filled in the trenches 210 and 214 so as to form the isolation structures 222 and 224.

With the method described above, the device isolation area, i.e. the area for the to-be-formed isolation structure 222 in the subsequent process, in the first device area 202 can be defined by the self-align mask. Accordingly, the critical dimension of the devices in the first device area 202 can be precisely controlled. Moreover, in the second device area 204, after the mask layer 208 and the protection layer 206 are removed in the subsequent process, the thick liner 216 over the surface of the exposed protection layer 206 protects the isolation structure 224 from damages during the etching process.

The following is a method of fabricating a memory device as an application of the method of fabricating the shallow trench isolation described above. The present invention, however, is not limited thereto.

FIGS. 3A–3F are cross sectional views showing a progression of a method of fabricating a memory device according to another embodiment of the present invention.

Figure 3A:
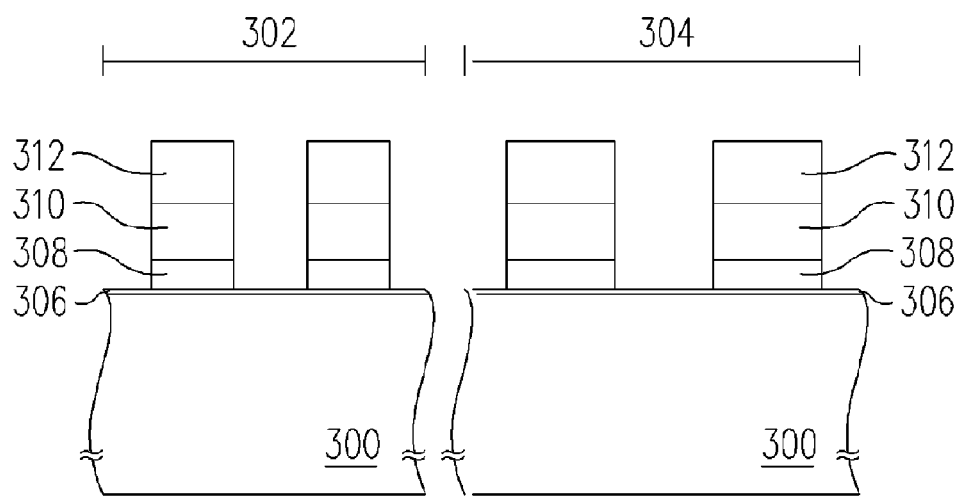
FIGS. 3A–3F are cross sectional views showing a progression of a method of fabricating a memory device according to another embodiment of the present invention.

Referring to FIG. 3A, a substrate 300 is provided, which comprises a memory cell area 302 and a peripheral circuit area 304. A tunneling layer 306 and the patterned floating gate 308 are formed over the substrate 300. Wherein, the tunneling layer 306 can be made of silicon oxide, which can be formed, for example, by thermal oxidation. In some embodiments, mask layers 310 and 312 are formed over the floating gate 308. The mask layer 310 can be made of silicon nitride, which can be formed, for example, by chemical vapor deposition (CVD). In addition, the mask layer 312 can be made of borosilicate glass (BSG), which can be formed, for example, by CVD.

Figure 3B:
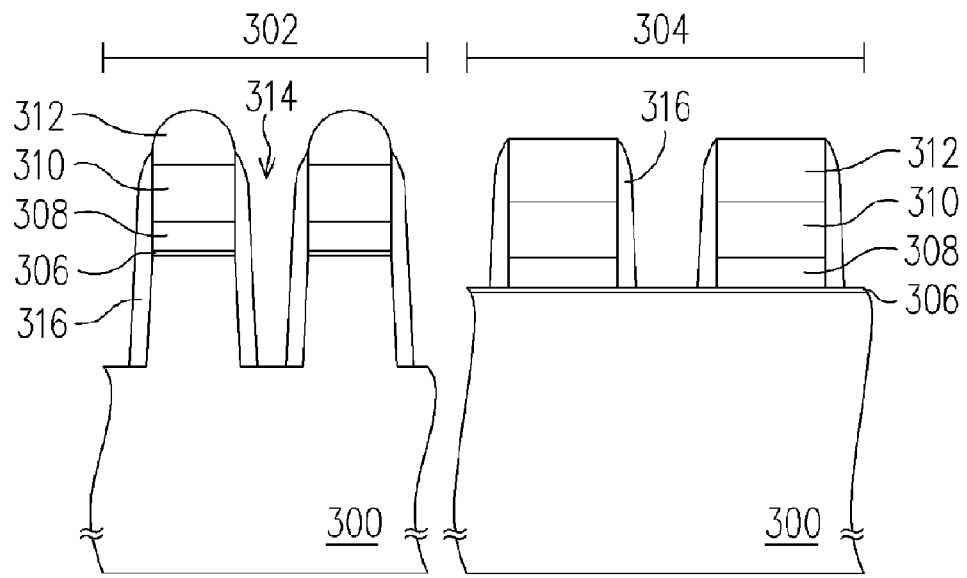

Referring to FIG. 3B, the floating gate 308 in the memory cell area 302 serves as a self-align mask for etching the tunneling layer 306 and the substrate 300. Accordingly, the trenches 314 are formed in the substrate 300 of the memory cell area 302. The etching method can be, for example, an anisotropic etching method. In this embodiment, the peripheral circuit area 304 is covered by a photoresist layer (not shown), and is thus protected from the etching damage. In addition, the top corners of the mask layer 312 in the memory cell area 302 may also be damaged during the etching process. Accordingly, the thickness of the top corners of the mask layer 312 is reduced.

Next, spacers 316 are formed on the sidewalls of the floating gate 308 in the peripheral circuit area 304. The spacers 316 can be made of oxide or nitride. In some embodiment, the spacers 316 are further formed on the sidewalls of the mask layers 312 and 310, the floating gate 308 and the trenches 314 in the memory cell area 302. Wherein, the process of forming the spacers 316 may comprise, for example, forming an isolation layer over the substrate 300 and performing an anisotropic etching process on the isolation layer.

Figure 3C:
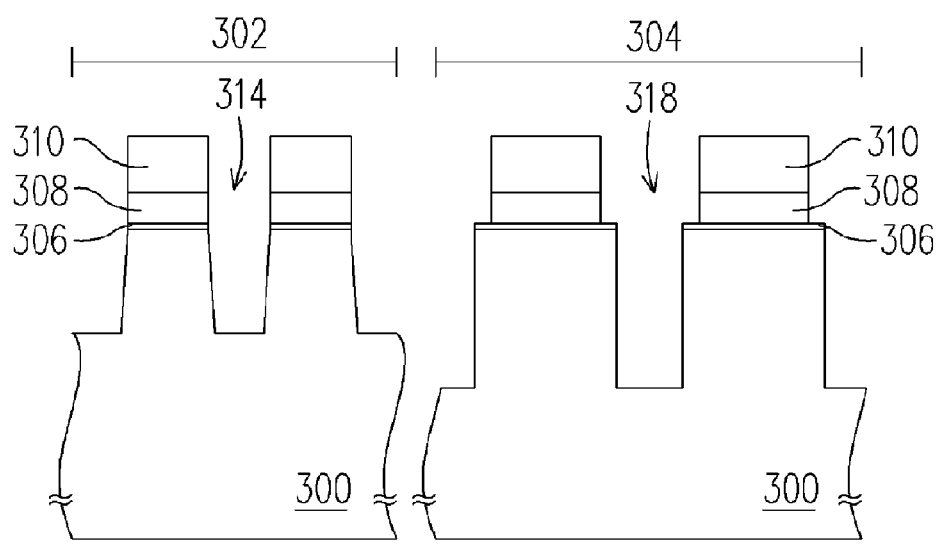

Referring to FIG. 3C, the floating gate 308 and the spacers 316 in the peripheral circuit area 304 serve as a self-align mask for etching the tunneling layer 306 and the substrate 300. Accordingly, the trenches 318 are formed in the substrate 300 of the peripheral circuit area 304. In this embodiment, the memory cell area 302 is covered by a photoresist layer (not shown), and is thus protected from damages during the etching process. In some embodiments, since the logic devices formed in the second device area 304 in the subsequent process are high-voltage devices, the trenches 318 herein should be deeper than the first trenches 314 in the memory cell area 302. With the deeper trenches 318, the isolation performance of the isolation structure formed in the peripheral circuit area 304 is improved. Next, the spacers 316 and the mask layer 312 are removed.

Figure 3D:
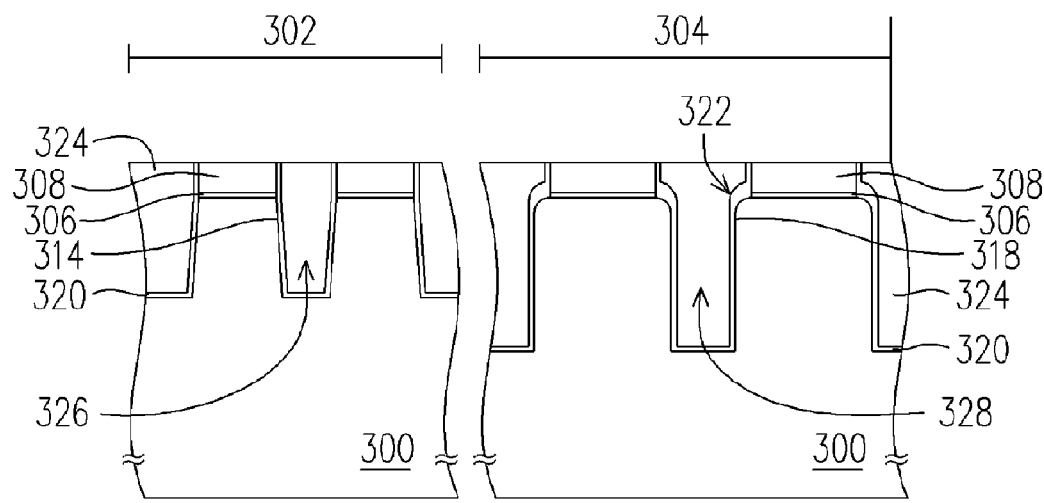

Referring to FIG. 3D, a liner 320 is formed on the sidewalls of the exposed floating gate 308, the surfaces of the trenches 314 and 318, and the surface of the tunneling layer 306 exposed in the peripheral circuit area 304. The liner 320 can be made of silicon oxide, which can be formed, for example, by thermal oxidation. If the tunneling layer 306 is also made of silicon oxide, the exposed tunneling layer 306 in the peripheral circuit area 304 will be oxidized. Accordingly, the area of the liner 320 indicated by 322 will have a round curve. In some embodiments, due to the rounding of the liner 320 over the exposed tunneling layer 306, the liner 320 thereon is thicker than that on the other areas.

An isolation layer 324 is then filled in the trenches 314 and 318. The mask layer 310 and portions of the isolation layer 324 are removed so as to form the isolation structures 326 and 328. Wherein, the planarization method can be, for example, chemical-mechanical polish (CMP) process.

Figure 3E:
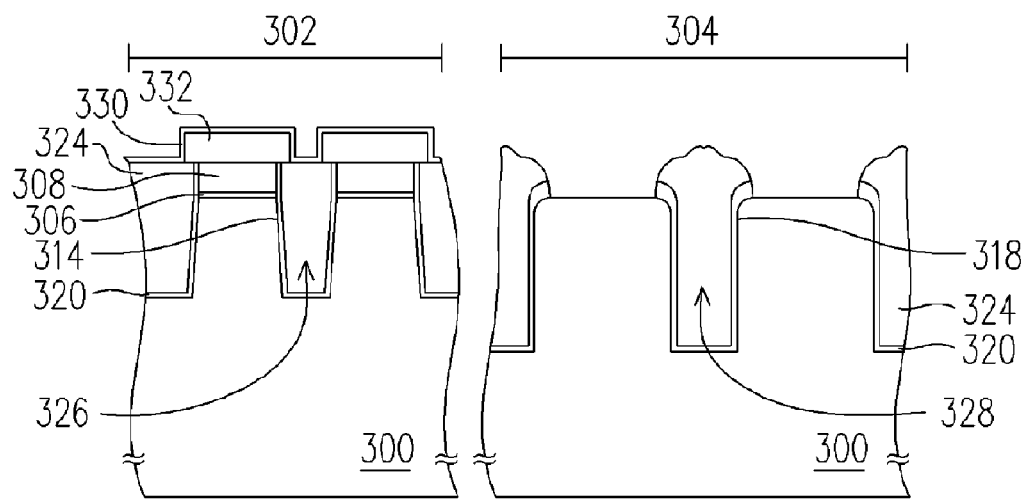

Referring to FIG. 3E, an inter-gate dielectric layer 330 is formed over the surface of the floating gate 308 in the memory cell area 302. In some embodiments, before forming the inter-gate dielectric layer 330, an additional floating gate 332 is formed over the floating gate 308 in the memory cell area 302 so as to increase the contact area of the floating gates 308 and 332 and the gate dielectric layer 330. Accordingly, the gate coupling ratio (GCR) of the memory device is enhanced. In some embodiments, the floating gate 332 further covers a portion of the isolation structure 326.

Next, the floating gate 308 and the tunneling layer 306 in the peripheral circuit area 304 are removed. The process of removing the floating gate 308 and the tunneling layer 306 can be, for example, an isotropic-etching process or a wet-etching process. Though a portion of the isolation layer 324 can be damaged during the etching process, the thicker liner 320 over the exposed tunneling layer 306 can protect the isolation structure 328 from etching damages. Accordingly, the conventional isolation structure with hump shape can be avoided and therefore the electrical isolation of the isolation structure 328 is improved. In addition, the memory cell area 302 is covered by the photoresist layer (not shown), and is thus prevented from etching damage.

Figure 3F:
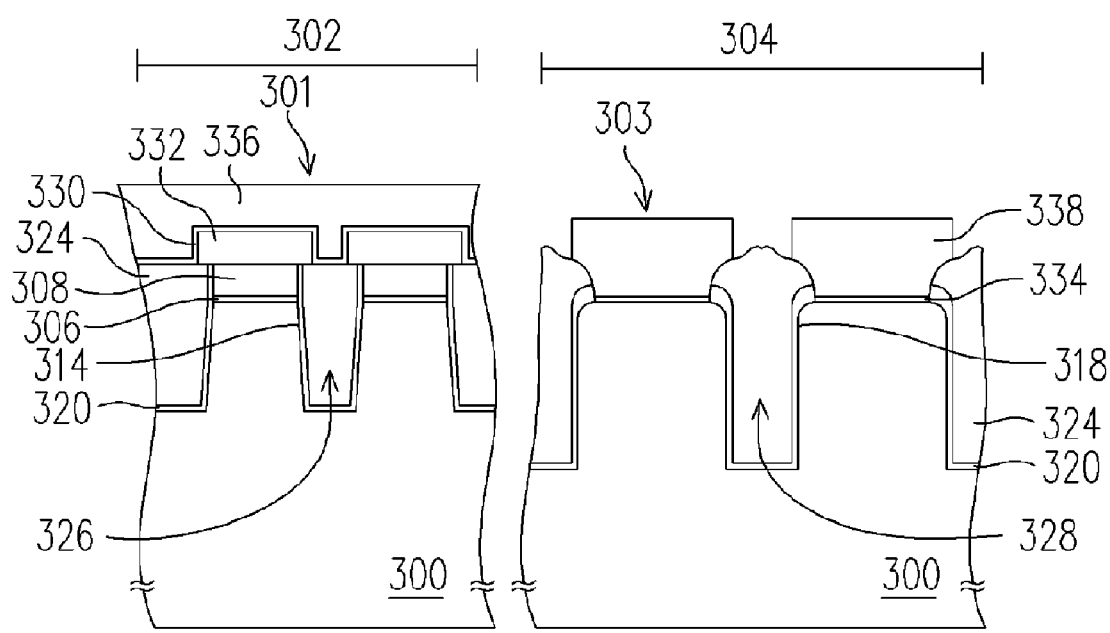

Referring to FIG. 3F, a gate dielectric layer 334 is formed over the surface of the substrate 300 in the peripheral circuit area 304. The gate dielectric layer 334 can be made of silicon oxide, which can be formed, for example, by thermal oxidation.

A control gate 336 is then formed over the gate dielectric layer 330 in the memory cell area 302, and a gate layer 338 is formed over the gate dielectric layer 334 in the peripheral circuit area 304. The control gate 336 and the gate layer 338 can be made of polysilicon, doped polysilicon or other conductive materials. The process of forming the control gate 336 and the gate layer 338 comprises, for example, forming a conductive layer over the substrate 300, and defining the conductive layer by photolithographic and etching processes. In some embodiments, a portion of the gate layer 338 is formed over the isolation structure 328.

The following is a structure obtained according to the fabrication method of the memory device described above. Referring to FIG. 3F, the memory device comprises the substrate 300, at least one stacked structure of memory cell 301, a plurality of the isolation structures 326, at least one stacked device structure 303 and a plurality of isolation structures 328.

The substrate 300 comprises the memory cell area 302 and the peripheral circuit area 304. The memory cell area 302 comprises a plurality of trenches 314, and the peripheral circuit area 304 comprises a plurality of trenches 318. In some embodiments, the trenches 318 are deeper than the trenches 314. Accordingly, the isolation structures 328 have better isolation performance.

Each stacked structure of memory cell 301 is disposed between two neighboring trenches 314 over the substrate 300. The stacked structure of memory cell 301 comprises at least the tunneling layer 306, the floating gate 308, the inter-gate dielectric layer 330 and the control gate 336. In some embodiments, an additional floating gate 332 is disposed between the floating gate 308 and the inter-gate dielectric layer 330 so as to increase the contact area of the floating gates 308 and 332 and the inter-gate dielectric layer 330. Accordingly, the gate coupling ratio (GCR) of the memory device is thus enhanced. In some embodiments, the floating gate 332 further covers a portion of the isolation structure 326.

Each isolation structure 326 is disposed between two neighboring stacked structures of memory cells 301 in the memory cell area 302. The isolation structure 326 comprises the liner 320 and the isolation layer 324. The liner 320 is disposed on the sidewalls of the tunneling layer 306 and the floating gate 308 and the surfaces of the trenches 314. In addition, the isolation layer 324 covers the liner 320 and at least fills the trenches 314.

Each stacked device structure 303 is disposed between two neighboring trenches 318 over the substrate 300 in the peripheral circuit area 304. The stacked device structure 303 comprises at least the gate dielectric layer 334 and the gate 338. The gate dielectric layer 334 covers part of the substrate 300. In some embodiments, the gate layer 338 covers part of the isolation structures 328.

Each isolation structure 328 is disposed between two neighboring stacked device structures 303 in the peripheral circuit area 304. The isolation structure 328 comprises the liner 320 and the isolation layer 324. The liner 320 is disposed on the sidewalls of the gate dielectric layer 334, the surfaces of the trenches 318 and the surface of the substrate 300 not covered by the gate dielectric layer 334. On the other hand, the isolation layer 324 covers the liner 320 and at least fills the trenches 318. In particular, the liner 320 has round curves on the surface of the substrate 300 not covered by the gate dielectric layer 334, and is thicker than liner 320 on the other areas.

In the process of fabricating the stacked structure of memory cell in the memory cell area, the thick liner is formed on the surface of the tunneling layer not covered by the floating gate in the peripheral circuit area. In the subsequent process when the floating gate and the tunneling layer are removed in the peripheral circuit area, the isolation structures can be protected from etching damage. Accordingly, the isolation performance of the isolation structure is thus improved. In other words, after removing the floating gate and the tunneling layer in the peripheral circuit area, the liner not covered by the gate dielectric layer will have a round curve.

Accordingly, the present invention has at least the following advantages:

1. For the memory cell area or the first device area according to the present invention, the device isolation area, i.e. the area for the to-be-formed isolation structure in the subsequent process, can be defined with the self-align mask. Accordingly, the critical dimension of the devices in the first device area or the memory cell area can be precisely controlled.

2. In the second device area or the peripheral circuit area, after removing, the tunneling layer and the floating gate or the mask layer and the protection layer in the subsequent process, the thick liner formed over the surface of the exposed tunneling layer or the exposed protection layer protects the isolation structure from etching damageg. Accordingly, the isolation performance of the isolation structure is thus enhanced.

3. For the memory cell area, the isolation structure is prevented from etching damage in the present invention. Therefore, unlike the peripheral circuit area, the memory cell area does not require spacers as part of the etch mask. Accordingly, the density in the memory cell area is not sacrificed. Further, the present invention also prevents the isolation structure from etching damage in the periphery circuit area. In other words, the present invention meets the requirement of different device areas and performs suitable process.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A memory device, comprising:
    a substrate, comprising a memory cell area and a peripheral circuit area, the memory cell area comprising a plurality of first trenches, the peripheral circuit area comprising a plurality of second trenches;
    at least one stacked structure of memory cell disposed between two neighboring first trenches in the memory cell area over the substrate, the stack structure of memory cell comprising at least a tunneling layer, a floating gate, a inter-gate dielectric layer and a control gate;
    a plurality of first isolation structures disposed between the neighboring stacked structures of memory cells in the memory cell area, the first isolation structure comprising:
        a first liner disposed on sidewalls of the tunneling layer and the floating gate and a surface of the first trench; and
        a first isolation layer covering the first liner, at least filling the first trenches;
    at least one stacked device structure disposed between two neighboring second trenches in the peripheral circuit area over the substrate, the stacked device structure comprising at least a gate dielectric layer and a gate layer, wherein the gate dielectric layer covers part of the substrate; and
    a plurality of second isolation structures disposed between neighboring stacked device structures in the peripheral circuit, the second isolation structure comprising:
        a second liner disposed on a sidewall of the gate dielectric layer, a surface of the second trenches and a surface of the substrate not covered by the gate dielectric layer, the second liner having a round curve at an area not covered by the gate dielectric layer; and
        a second isolation layer covering the second liner, at least filling the second trenches.

2. The memory device of claim 1, wherein the second liner layer at the area not covered by the gate dielectric layer is thicker than that in the other areas.

3. The memory device of claim 1, wherein the second trench is deeper than the first trench.

4. The memory device of claim 1, further comprising an additional floating gate disposed between the floating gate and the inter-gate dielectric layer.

* * * * *